(12) United States Patent
Sander

(10) Patent No.: US 12,439,526 B2
(45) Date of Patent: Oct. 7, 2025

(54) METHOD FOR ADDITIVE MANUFACTURING ELECTRONICS AND A PRINTING SUPPORT FOR THE MANUFACTURING

(71) Applicant: HENSOLDT Sensors GmbH, Taufkirchen (DE)

(72) Inventor: Jörg Sander, Ulm (DE)

(73) Assignee: HENSOLDT Sensors GmbH, Taufkirchen (DE)

( * ) Notice: Subject to any disclaimer, the term of this patent is extended or adjusted under 35 U.S.C. 154(b) by 89 days.

(21) Appl. No.: 18/373,866

(22) Filed: Sep. 27, 2023

(65) Prior Publication Data

US 2024/0107681 A1 Mar. 28, 2024

(30) Foreign Application Priority Data

Sep. 28, 2022 (EP) .................................. 22198536

(51) Int. Cl.
*H05K 3/12* (2006.01)
*B33Y 10/00* (2015.01)
(Continued)

(52) U.S. Cl.
CPC .............. *H05K 3/125* (2013.01); *B33Y 10/00* (2014.12); *B33Y 30/00* (2014.12); *B33Y 50/02* (2014.12); *B33Y 80/00* (2014.12); *H05K 1/0268* (2013.01); *B29C 64/112* (2017.08); *B29K 2995/0006* (2013.01); *B29L 2031/34* (2013.01); *H05K 1/16* (2013.01); *H05K 1/162* (2013.01); *H05K 1/165* (2013.01); *H05K 1/167* (2013.01); *H05K 2201/10098* (2013.01); *H05K 2203/163* (2013.01)

(58) Field of Classification Search
None
See application file for complete search history.

(56) References Cited

U.S. PATENT DOCUMENTS

2010/0062145 A1* 3/2010 Bill .................. H05K 3/125
427/8
2015/0197063 A1 7/2015 Shinar et al.

FOREIGN PATENT DOCUMENTS

NO 2008102266 A2 8/2008

OTHER PUBLICATIONS

European Patent Office, Extended European Search Report, Application No. 22198536.9, dated Feb. 14, 2023, 9 pages.

* cited by examiner

*Primary Examiner* — Yung-Sheng M Tsui
*Assistant Examiner* — Meldoy Tsui
(74) *Attorney, Agent, or Firm* — Mahamedi IP Law LLP

(57) ABSTRACT

A system for additive manufacturing of an electronic device includes providing a printing support with an electric circuitry embedded in a dielectric encapsulation and at least one supply terminal connected to the electric circuitry. The method further includes an additive printing the electronic device on the printing support by forming a conductive structure embedded in a dielectric base material and at least one device terminal exposed on a surface of the electronic device, wherein the at least one supply terminal of the printing support is arranged to electrically contact the at least one device terminal. The method further includes applying electric signals from the at least one supply terminal to the at least on device terminal to measure an electric characteristic of the conductive structure during the process of additive printing of the electronic device.

8 Claims, 2 Drawing Sheets

(51) Int. Cl.
   *B33Y 30/00*   (2015.01)
   *B33Y 50/02*   (2015.01)
   *B33Y 80/00*   (2015.01)
   *H05K 1/02*    (2006.01)
   *B29C 64/112*      (2017.01)
   *B29L 31/34*       (2006.01)
   *H05K 1/16*        (2006.01)

METHOD FOR ADDITIVE MANUFACTURING ELECTRONICS AND A PRINTING SUPPORT FOR THE MANUFACTURING

TECHNICAL FIELD

The present invention relates to a method for additive manufacturing of an electronic device and a printing support for the additive manufacturing and, in particular, to an in-print control and property adjustment of additively manufactured electronics (AME).

BACKGROUND

In conventional additive manufacturing tools all print jobs are done on a polymer layer, which is an interface between the printer table itself and the printed device. This polymer layer is electrically non-conductive and transfers only a thermal load from the print table to the AME-device to support the curing or the self-welding process inside the AME-device. This prevents a monitoring of the electrical characteristics such as an electrical conductivity or impedance of the AME-device during the build-up phase inside an AME-printer. The properties of the AME-device could only be measured after the printing process.

Moreover, the process of additive manufacturing is carried out within particular tolerances and these tolerances result in production tolerances of the manufactured AME-device. This bears the risk that the manufactured AME-device has finally an electric characteristic which is outside a target specification.

Therefore, there is a demand for improving the control over the additive manufacturing process, in particular for AME-devices.

SUMMARY OF THE INVENTION

At least some of the above-mentioned problems are overcome by a method of additive manufacturing, a printing support, and an additive manufacturing tool, according to the subject matters of the independent claims.

The present invention relates to a system for additive manufacturing of an electronic device (AME-device). The method comprises:
providing a printing support with an electric circuitry embedded in a dielectric encapsulation and at least one supply terminal connected to the electric circuitry;
additive printing of the electronic device on the printing support by forming a conductive structure embedded in a dielectric base material and at least one device terminal exposed on a surface of the electronic device, wherein the at least one supply terminal of the printing support is arranged to electrically contact the at least one device terminal; and
applying electric signals from the at least one supply terminal to the at least on device terminal to measure an electric characteristic of the conductive structure during the process of additive printing of the electronic device.

The electric circuitry in the printing support may be only a single wire connecting the supply terminals with external terminals to feed signals through the printing support to the device terminals. Alternatively or additionally, the circuitry may include passive or active electric components that form or modify the electric signals applied during the printing process. The surface that exposes the device terminal may face the printing support.

Optionally, the electric signals applied to the at least one supply terminals are adapted to measure at least one of the following characteristics of the electronic device: a resistance, a capacitance, an inductance or an impedance. For example, the electric signals may be a DC-(direct current) signal to measure a resistance, or an AC-signals to measure a capacitance or inductance. For this, a voltage or a current level or a frequency of the AC-signal can be adjusted in accordance to the circuitry.

Optionally, the step of additive printing is modified based on the measured electric characteristic to achieve a target electric characteristic for the manufactured electronic device.

Optionally, the modified additive printing includes one or more of the following:
changing a cross-section of an electric conductive line at one or more locations in the conductive structure (to change a resistance, e.g.),
changing a form or shape of an electric conductive line to modify the capacitance or inductance of the conductive structure,
changing a composition of a dielectric or conductive printing material utilized in the process of additive printing.

Optionally, the step of applying electric signals to measure the electric characteristic is repeated during the step of additive printing to enable a continuous monitoring of the printing process of the electronic device. For example, the electronic device may be additively printed in successive layers and the electric signals may be applied after a predetermined number of printed layers, wherein the predetermined number may depend on the conductive structure. For example, the conductive structure may be error-prone and in critical regions of it the monitoring of the electric characteristic can be carried out more frequently.

Optionally, the step of additive printing is an ink jet printing including printing of dielectric ink and printing an electric conductive ink.

This method may also be implemented in software or a computer program product or a software module in a control unit. Therefore, embodiment relate also to a computer-readable storage device or a computer program having a program code for controlling the control unit to perform the method, when the computer program is executed on a processor.

Further embodiments relate to a printing support configured for an additive manufacturing of an electronic device, wherein the electronic device includes at least one device terminal exposed on a surface of the electronic device. The printing support comprises: an electric circuitry embedded in a dielectric encapsulation and at least one supply terminal exposed on a support surface and connected to the electric circuitry. The at least one supply terminal is arranged to contact the at least one device terminal of the electronic device to enable a continuous monitoring of at least one electric characteristic of the electronic device during its additive manufacturing. For example, the supply terminal(s) may be formed at predetermined positions to be able to contact the device terminals. Alternatively or additionally, a supply terminal structure is formed with many terminals which can be activated or deactivated based on the electronic device to be printed.

According to further embodiments, an additive manufacturing tool comprises a printing support as described before and a control unit adapted to cause the application of the electric signals at the device terminals to continuously monitor the at least one electric characteristic of the electronic device during the additive manufacturing. The printing support may be connected to an external signal generation circuitry which is controlled by the control unit to apply the electric signals suitable for the particular electronic device.

When compared to a conventional printing table, embodiments replace a utilized polymer layer of the conventional printing table by an interface layer as printing support which includes a certain number of electrical contacts and wires arranged inside the polymer layer. This printing support provides exposed terminals (contacts) at a surface on which the additive manufacturing is carried out. These contacts are overprinted with conductive inks representing part of the AME-device. This printing support allows—during the printing process—to measure an electrical characteristic (e.g. a conductivity) of the electrical structure inside the AME-device to be additively manufactured.

BRIEF DESCRIPTION OF THE FIGURES

Various embodiments of the present invention will be described in the following by way of examples only, and with respect to the accompanying drawings, in which.

DETAILED DESCRIPTION

Various examples will now be described more fully with reference to the accompanying drawings in which some examples are illustrated.

Accordingly, while examples are capable of various modifications and alternative forms, the illustrative examples in the figures will herein be described in detail. It should be understood, however, that there is no intent to limit examples to the particular forms disclosed, but on the contrary, examples are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing illustrative examples only and is not intended to be limiting. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements and/or components, but do not preclude the presence or addition of one or more other features, steps, operations, elements, components and/or groups thereof.

Unless otherwise defined, all terms (including technical and scientific terms) used herein have the same meaning as commonly understood by one of ordinary skill in the art to which examples belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 1:
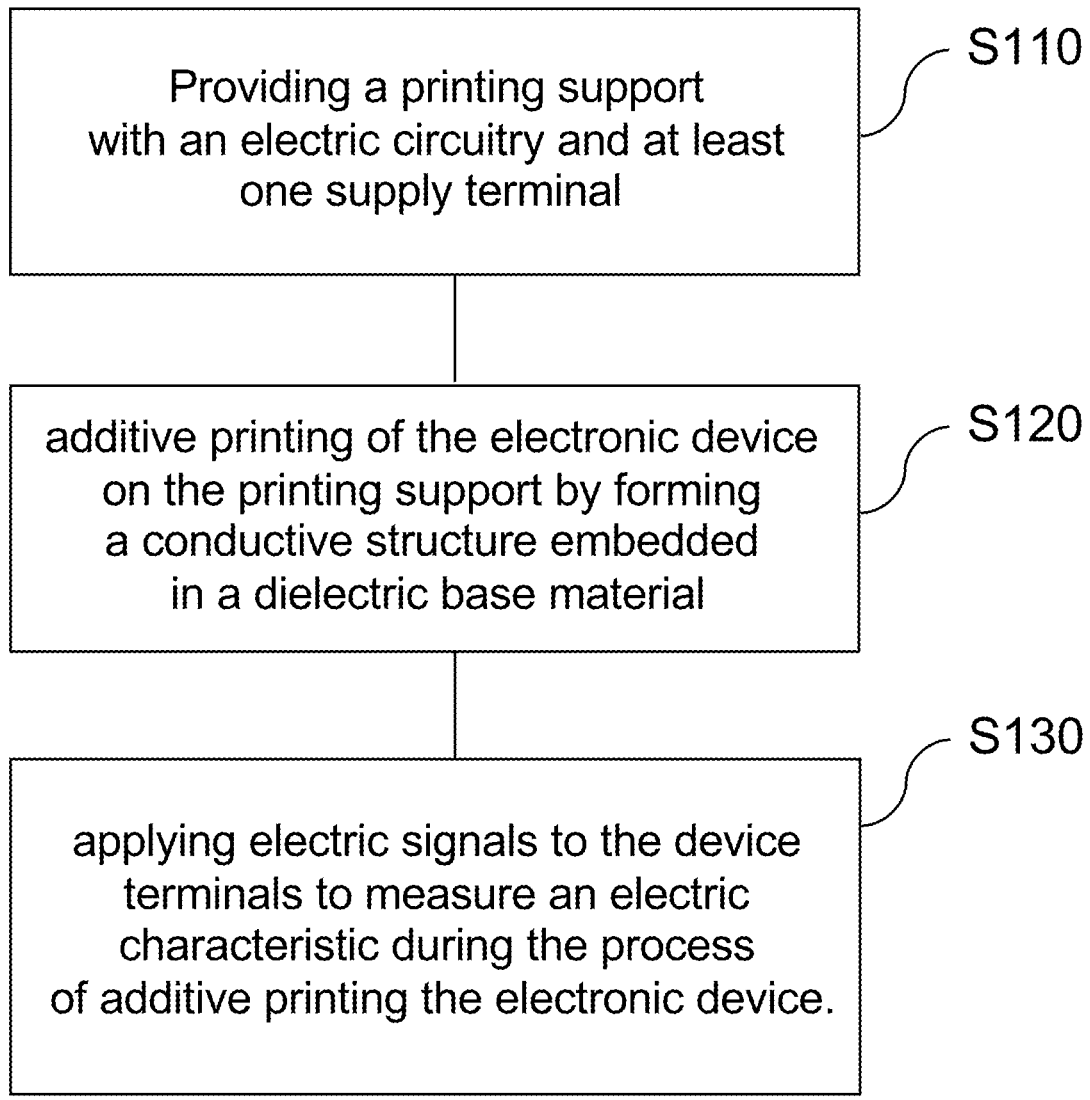
FIG. 1 illustrates a schematic flow chart of a method for additive manufacturing of an electronic device (AME-device) according to an embodiment.

FIG. 1 illustrates a schematic flow chart of a method for additively manufacturing an electronic device. The method comprises:

providing S110 a printing support with an electric circuitry embedded in a dielectric encapsulation and at least one supply terminal connected to the electric circuitry;

additive printing S120 of the electronic device on the printing support by forming a conductive structure embedded in a dielectric base material and at least one device terminal exposed on a surface of the electronic device, wherein the at least one supply terminal of the printing support is arranged to electrically contact the at least one device terminal; and applying S130 electric signals from the at least one supply terminal to the at least on device terminal to measure an electric characteristic of the conductive structure during the process of additive printing of the electronic device.

According to further embodiments, all features of the printing support as described herein may be realized as further optional method steps.

A person of skill in the art would readily recognize that steps of various above-described methods may be performed by programmed computers. Thus, this method may also be a computer-implemented method. Embodiments are also intended to cover program storage devices, e.g., digital data storage media, which are machine or computer readable and encode machine-executable or computer-executable programs of instructions, wherein the instructions perform some or all of the acts of the above-described methods, when executed on a computer or processor.

Figure 2:
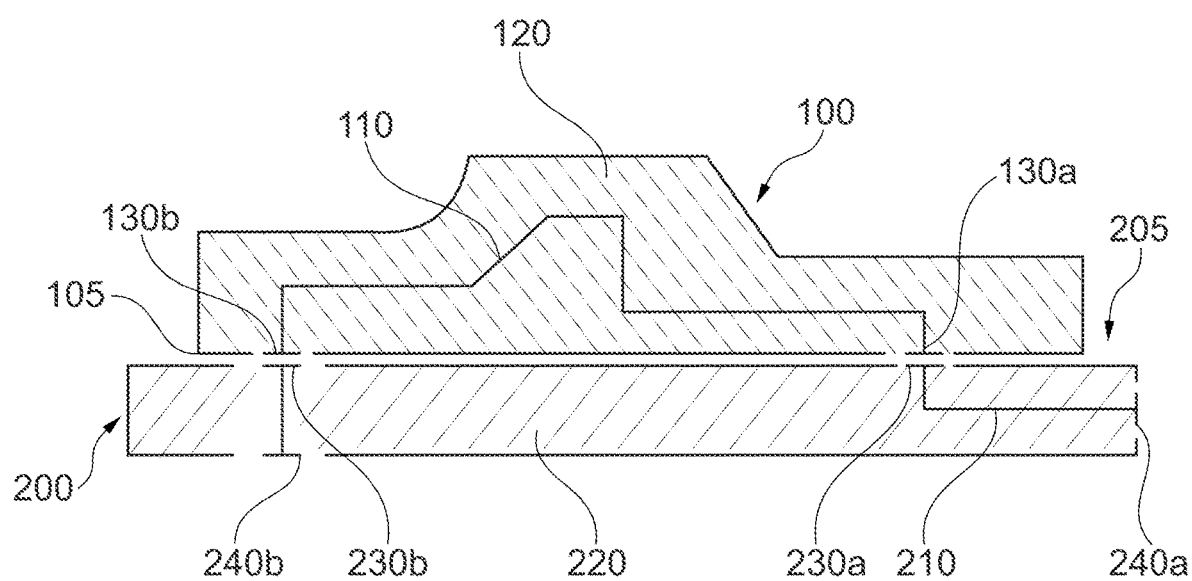
FIG. 2 depicts an AME-device according to an embodiment.

FIG. 2 illustrates schematically a resulting AME-device 100 manufactured on a printing support 200 according to embodiments.

The electronic device 100 is additively manufactured on top of a surface 205 of the printing support 200 and includes one or more device terminals 130a, 130b which are exposed on a surface 105 of the electronic device 100. The printing support 200 includes an electronic circuitry 210 comprised of one or more electrical lines 210 that can be connected to an external control unit (not shown) to supply particular measurement signals. For this, the printing support 200 further includes one or more supply terminals 230a, 230b to contact the one or more device terminals 130a, 130b. According to further embodiments the printing support 200 further includes one ore more external terminals 240a, 240b to provide contacts for connecting the printing support 200 to the extern control unit.

The lines 210 are embedded in an encapsulation material 220 which may be the same polymer material utilized for conventional printing tables. The supply terminal(s) 230a, 230b may be formed at those positions at which the AME-device 100 has device terminals 130a, 130b which are exposed to the surface 105. These device terminals 130a, 130b can be used to measure the electrical characteristic inside the AME-device 100.

According to the depicted embodiment, there is only a single electrical line 110 connecting the two device terminals 130a, 130b. The electrical line 110 is encapsulated in an encapsulation material 120 which provides the dielectric isolation of the embedded electrical line 110. The electric line 110 may, for example, constitute an antenna, where the device terminals 130a, 130b provide ground and a signal terminal.

According to further embodiments, more complex circuitries can be formed by an additive manufacturing inside an encapsulation material 120. In particular, a full three-dimensional or two-dimensional conductive structure 110 including capacitors, coils, resistors or other active or passive components can be formed using the additive manufacturing process. For this, for example, the inkjet technology can be utilized, wherein conductive inks can be used for forming electrically conductive lines or structures inside a dielectric encapsulation material which is likewise printed by a separate dielectric ink.

According to embodiments, the AME-device 100 may be printed layer by layer by ejecting either the dielectric ink or the conductive ink. The printing process may constantly be monitored by applying electrical signals by the printing support 200 using the supply terminals 230a, 230b received from the external terminals 240a, 240b. Therefore, the printing support 200 can be formed as layer or interface to be placed on the conventional printing table of the 3D printing tool.

For example, by using an external control unit connected to the external terminals 240a, 240b it is possible to monitor continuously electric characteristics of the AME-device 100 during the additive manufacturing process. Based on this monitoring, the additive manufacturing process can be adjusted or corrected. These adjustments may, for example, include a change in a cross-section of an electrical line. By this, the resistance, capacitance, inductance etc. can be modified. For example, by changing an orientation or a shape or form of the electrical line a capacitance or an inductance of the AME-device can be generated as desired or can be modified. An inductance can be generated, for example, by intentionally printing additional curved portions or by forming not a curved region but by arranging the electrical lines 110 as straight lines (to lower the inductance).

Embodiments therefore provide the possibility of changing the properties of an electrical device by adjusting the printing process already during the printing itself. In particular, there is no need to stop the printing process, but the electronic control unit can directly modify the printing process. For example, the respective software can already be configured in order to allow certain modifications which can be performed during the printing process based on the measured characteristics.

Aspects of embodiments can also be summarized as follows:

The printing support 200 may, for example, be realized by a printed board which has multiple conductive structures on it and terminals on which the 3D printing process can be carried out. Therefore, in contrast to conventional printing supports (e.g. formed as a glass or polymer material), embodiments use a printing support which has an electrical structure integrated into it with a number of predetermined terminals 130a, 130b which are adjusted dependent on the device 100 to be printed. The device terminals 130a, 130b may also be artificial terminals which are merely used for the monitoring of the printing process in order to ensure that the printed device 100 has a predetermined electrical characteristic. Later on, these device terminals 130a, 130b can be eliminated. Of course, it is also possible that already available device terminals 130a, 130b (i.e. terminals which the resulting device shall have) can be used for the monitoring process during the printing.

Although AME-devices vary with respect to their electrical conductivity due to the variation in thickness, width and distance, and/or the orientation of the conductive structure inside the AME device, these variations, including their tolerances, are already known during the printing process. Therefore, already when printing the AME-device 100, it can be decided about the quality of the resulting AME-device 100. Furthermore, embodiments enable an in-process control or even a direct adjustment of the electrical properties while performing the printing process. There is no need to wait until the AME-device has been manufactured in order to determine their electrical properties. This in-process control and adjustment is of particular interest for personalized items or cyber security issues.

The description and drawings merely illustrate the principles of the disclosure. It will thus be appreciated that those skilled in the art will be able to devise various arrangements that, although not explicitly described or shown herein, embody the principles of the disclosure and are included within its scope.

Furthermore, while each embodiment may stand on its own as a separate example, it is to be noted that in other embodiments the defined features can be combined differently, i.e. a particular feature descripted in one embodiment may also be realized in other embodiments. Such combinations are covered by the disclosure herein unless it is stated that a specific combination is not intended.

Although the invention has been illustrated and described in detail by way of preferred embodiments, the invention is not limited by the examples disclosed, and other variations can be derived from these by the person skilled in the art without leaving the scope of the invention. It is therefore clear that there is a plurality of possible variations. It is also clear that embodiments stated by way of example are only really examples that are not to be seen as limiting the scope, application possibilities or configuration of the invention in any way. In fact, the preceding description and the description of the figures enable the person skilled in the art to implement the exemplary embodiments in concrete manner, wherein, with the knowledge of the disclosed inventive concept, the person skilled in the art is able to undertake various changes, for example, with regard to the functioning or arrangement of individual elements stated in an exemplary embodiment without leaving the scope of the invention, which is defined by the claims and their legal equivalents, such as further explanations in the description.

LIST OF REFERENCE SIGNS 100 electronic device
105 surface of electronic device (e.g. first printed layer)
110 conductive structure
120 dielectric base material
130a, 130b device terminal(s)
200 printing support
205 support surface
210 electric circuitry
220 dielectric encapsulation
230a, 230b supply terminal(s)
240a, 240b external terminal(s)

What is claimed is:

1. A method for additive manufacturing of an electronic device, the method comprising:
   providing a printing support with an electric circuitry embedded in a dielectric encapsulation and at least one supply terminal connected to the electric circuitry;
   additive printing the electronic device on the printing support by forming a conductive structure embedded in a dielectric base material and at least one device terminal exposed on a surface of the electronic device, wherein the at least one supply terminal of the printing support is arranged to electrically contact the at least one device terminal; and
   applying electric signals from the at least one supply terminal to the at least on device terminal to measure an electric characteristic of the conductive structure during the process of additive printing of the electronic device.

2. The method of claim 1, wherein the electric signals applied to the at least one supply terminals are adapted to measure at least one of the following characteristics of the electronic device: a resistance, a capacitance, an inductance or an impedance.

3. The method according to claim 1, wherein the step of additive printing is modified based on the measured electric characteristic to achieve a target electric characteristic for the manufactured electronic device.

4. The method of claim 3, the modified additive printing includes one or more of the following:
   changing a cross-section of an electric conductive line at one or more locations in the conductive structure,
   changing a form or shape of an electric conductive line to modify the capacitance or inductance of the conductive structure,
   changing a composition of a dielectric or conductive printing material utilized in the process of additive printing.

5. The method according to claim 1, wherein the step of applying electric signals to measure the electric characteristic is repeated during the step of additive printing to enable a continuous monitoring of the printing process of the electronic device.

6. The method according to claim 1, wherein the step of additive printing is an ink jet printing including printing of dielectric ink and printing an electric conductive ink.

7. A printing support for an additive manufacturing of an electronic device, the electronic device includes at least one device terminal exposed on a surface of the electronic device, the printing support comprising:
   an electric circuitry embedded in a dielectric encapsulation;
   at least one supply terminal exposed on a support surface and connected to the electric circuitry,
   wherein the at least one supply terminal is arranged to contact the at least one device terminal of the electronic device to enable a continuous monitoring of at least one electric characteristic of the electronic device during its additive manufacturing.

8. An additive manufacturing tool comprising:
   a printing support according to claim 7; and
   a control unit adapted to cause the application of the electric signals at at least one device terminal to continuous monitor the at least one electric characteristic of the electronic device during the additive manufacturing.

* * * * *